US011094667B2

(12) United States Patent
Nakamitsu et al.

(10) Patent No.: US 11,094,667 B2
(45) Date of Patent: Aug. 17, 2021

(54) BONDING APPARATUS, BONDING SYSTEM, BONDING METHOD, AND RECORDING MEDIUM

(71) Applicant: Tokyo Electron Limited, Tokyo (JP)

(72) Inventors: Takashi Nakamitsu, Kumamoto (JP); Shuhei Matsumoto, Kumamoto (JP); Toshifumi Inamasu, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 71 days.

(21) Appl. No.: 16/347,856

(22) PCT Filed: Oct. 10, 2017

(86) PCT No.: PCT/JP2017/036657
§ 371 (c)(1),
(2) Date: May 7, 2019

(87) PCT Pub. No.: WO2018/088091
PCT Pub. Date: May 17, 2018

(65) Prior Publication Data
US 2019/0312006 A1 Oct. 10, 2019

(30) Foreign Application Priority Data

Nov. 9, 2016 (JP) .............................. JP2016-218579

(51) Int. Cl.
H01L 23/00 (2006.01)
H01L 21/67 (2006.01)
(Continued)

(52) U.S. Cl.
CPC .............. H01L 24/75 (2013.01); B23K 20/00 (2013.01); H01L 21/02 (2013.01);
(Continued)

(58) Field of Classification Search
CPC ... H01L 24/75; H01L 21/02; H01L 21/67207; H01L 21/68; H01L 21/683; H01L 24/94;
(Continued)

(56) References Cited

U.S. PATENT DOCUMENTS

2012/0127485 A1* 5/2012 Yamauchi ............... H01L 24/81
356/614
2012/0224945 A1* 9/2012 Douki ................... H01L 21/681
414/758
(Continued)

FOREIGN PATENT DOCUMENTS

JP 2009-200117 A 9/2009
JP 2015-018919 A 1/2015

OTHER PUBLICATIONS

International Search Report for International Application No. PCT/JP2017/036657, dated Dec. 26, 2017.

Primary Examiner — George R Koch
(74) Attorney, Agent, or Firm — Pearne & Gordon LLP

(57) ABSTRACT

A bonding apparatus configured to bond substrates includes a first holder configured to vacuum-exhaust a first substrate to attract and hold the first substrate on a bottom surface thereof; a second holder disposed under the first holder and configured to vacuum-exhaust a second substrate to attract and hold the second substrate on a top surface thereof; a rotator configured to rotate the first holder and the second holder relatively; a moving device configured to move the first holder and the second holder relatively in a horizontal direction; three position measurement devices disposed at the first holder or the second holder rotated by the rotator and configured to measure a position of the first holder or the second holder; and a controller configured to control the rotator and the moving device based on measurement results of the three position measurement devices.

9 Claims, 10 Drawing Sheets

(51) Int. Cl.
*H01L 21/68* (2006.01)
*H01L 21/02* (2006.01)
*B23K 20/00* (2006.01)
*H01L 21/683* (2006.01)

(52) U.S. Cl.
CPC ........ *H01L 21/67207* (2013.01); *H01L 21/68* (2013.01); *H01L 21/683* (2013.01); *H01L 24/94* (2013.01); *H01L 2224/759* (2013.01); *H01L 2224/75744* (2013.01); *H01L 2224/75802* (2013.01)

(58) Field of Classification Search
CPC . H01L 2224/75744; H01L 2224/75802; H01L 2224/759; B23K 20/00; B32B 41/00; B32B 2041/04; B29C 66/836
See application file for complete search history.

(56) References Cited

U.S. PATENT DOCUMENTS

2016/0009070 A1\* 1/2016 Hayashi .................. B32B 37/18
156/64
2016/0155721 A1\* 6/2016 Sugakawa ......... H01L 21/67248
438/5

\* cited by examiner

BONDING APPARATUS, BONDING SYSTEM, BONDING METHOD, AND RECORDING MEDIUM

TECHNICAL FIELD

Cross-Reference to Related Application

This application is a 371 of PCT/JP2017/036657 Oct. 10, 2017.

This application claims the benefit of Japanese Patent Application No. 2016-218579 filed on Nov. 9, 2016, the entire disclosures of which are incorporated herein by reference.

The various embodiments described herein pertain generally to a bonding apparatus configured to bond substrates, a bonding system equipped with the bonding apparatus, a bonding method using the bonding apparatus and a recording medium.

BACKGROUND ART

Recently, semiconductor devices are getting miniaturized. If a plurality of highly integrated semiconductor devices is placed on a horizontal plane and these semiconductor devices are connected by a wiring to be produced as a product, a wiring length is increased. As a result, resistance of the wiring is increased, and there is a concern that a wiring delay may be increased.

In this regard, there is proposed using a three-dimensional integration technique of stacking semiconductor devices three-dimensionally. In this three-dimensional integration technique, two sheets of semiconductor wafers (hereinafter, referred to as "wafers") are bonded by using a bonding system described in, for example, Patent Document 1. By way of example, the bonding system is equipped with a surface modifying apparatus configured to modify to-be-bonded surfaces of wafers; a surface hydrophilizing apparatus configured to hydrophilize the surfaces of the wafers which are modified by the surface modifying apparatus; a bonding apparatus configured to bond the wafers having the surfaces which are hydrophilized by the surface hydrophilizing apparatus. In this bonding system, the surfaces of the wafers are modified in the surface modifying apparatus by performing a plasma processing on the surfaces of the wafers. Further, in the surface hydrophilizing apparatus, the surfaces of the wafers are hydrophilized by supplying pure water onto the surfaces thereof. Then, the wafers are bonded in the bonding apparatus by a Van der Waals force and a hydrogen bond (intermolecular force).

In the aforementioned bonding apparatus, one wafer (hereinafter, referred to as "upper wafer") is held by using an upper chuck, and the other wafer (hereinafter, referred to as "lower wafer") is held by a lower chuck provided under the upper chuck. While being held by these upper and lower chucks, the upper wafer and the lower wafer are bonded. Here, before the wafers are bonded, a position of the lower chuck with respect to the upper chuck in a horizontal direction is adjusted by moving the lower chuck in the horizontal direction with a moving device, and, also, a position of the lower chuck in a rotational direction (a direction of the lower chuck) is adjusted by rotating the lower chuck with a moving device.

PRIOR ART DOCUMENT

Patent Document 1: Japanese Patent Laid-open Publication No. 2015-018919

DISCLOSURE OF THE INVENTION

Problems to be Solved by the Invention

In the bonding apparatus of the aforementioned Patent Document 1, however, when adjusting the position of the lower chuck in the rotational direction after adjusting the position of the lower chuck in the horizontal direction, a rotation shaft may be deviated in the horizontal direction when rotating the lower chuck depending on control accuracy of the moving device. In such a case, the horizontal position of the lower chuck with respect to the upper chuck may be deviated, and, resultantly, the upper wafer and the lower wafer may be deviated from each other when they are bonded. In this regard, there is still a room for improvement in bonding the wafers.

The purpose of exemplary embodiments described herein is to provide a technique capable of performing a bonding processing of bonding substrates appropriately by performing position adjustment of a first holder configured to hold a first substrate and a second holder configured to hold a second substrate appropriately.

Means for Solving the Problems

In one exemplary embodiment, a bonding apparatus configured to bond substrates includes a first holder configured to vacuum-exhaust a first substrate to attract and hold the first substrate on a bottom surface thereof; a second holder disposed under the first holder and configured to vacuum-exhaust a second substrate to attract and hold the second substrate on a top surface thereof; a rotator configured to rotate the first holder and the second holder relatively; a moving device configured to move the first holder and the second holder relatively in a horizontal direction; three position measurement devices disposed at the first holder or the second holder rotated by the rotator and configured to measure a position of the first holder or the second holder; and a controller configured to control the rotator and the moving device based on measurement results of the three position measurement devices.

According to the exemplary embodiment, since the position of the first holder or the second holder is measured by using the three position measurement devices, eccentric amounts (deviation amounts) between the first holder and the second holder in the rotational direction, the X direction and the Y direction can be respectively calculated, and correction amounts for the first holder or the second holder in the rotational direction, the X direction and the Y direction can be calculated from the measurement results. By controlling the rotator and the moving device based on the calculation results, the relative position between the first holder and the second holder can be appropriately adjusted. Accordingly, the bonding between the first substrate held by the first holder and the second substrate held by the second holder can be carried out appropriately after the position adjustment.

In another exemplary embodiment, a bonding system equipped with a bonding apparatus comprises a processing station equipped with the bonding apparatus; and a carry-in/out station configured to place thereon multiple first substrates, multiple second substrates or multiple combined substrates each obtained by bonding the first substrate and the second substrate, and configured to carry the first substrates, the second substrates or the combined substrates into/from the processing station. The processing station comprises a surface modifying apparatus configured to modify surfaces of the first substrate or the second substrate to be bonded; a surface hydrophilizing apparatus configured to hydrophilize the surface of the first substrate or the second substrate modified by the surface modifying apparatus; and a transfer device configured to transfer the first substrates, the second substrates or the combined substrates with respect to the surface modifying apparatus, the surface hydrophilizing apparatus and the bonding apparatus. In the bonding apparatus, the first substrate and the second substrate having the surfaces hydrophilized by the surface hydrophilizing apparatus are bonded.

In still another exemplary embodiment, in a bonding method of bonding substrates by using a bonding apparatus, the bonding apparatus comprises a first holder configured to vacuum-exhaust a first substrate to attract and hold the first substrate on a bottom surface thereof; a second holder disposed under the first holder and configured to vacuum-exhaust a second substrate to attract and hold the second substrate on a top surface thereof; a rotator configured to rotate the first holder and the second holder relatively; a moving device configured to move the first holder and the second holder relatively in a horizontal direction; and three position measurement devices disposed at the first holder or the second holder rotated by the rotator and configured to measure a position of the first holder or the second holder. The bonding method comprises measuring the position of the first holder or the second holder by using the three position measurement devices; and adjusting a relative position between the first holder and the second holder by controlling the rotator and the moving device based on measurement results in the measuring of the position.

In yet another exemplary embodiment, there is provided a computer-readable recording medium having stored thereon computer-executable instructions that, in response to execution, cause the bonding apparatus to perform the bonding method.

Effect of the Invention

According to the exemplary embodiments as described above, it is possible to perform the bonding processing of bonding the substrates appropriately by performing the position adjustment of the first holder configured to hold the first substrate and the second holder configured to hold the second substrate appropriately.

DETAILED DESCRIPTION

Hereinafter, various exemplary embodiments will be described with reference to accompanying drawings. Further, it should be noted that the exemplary embodiments are not intended to be anyway limiting.

<1. Configuration of Bonding System>

Figure 1:
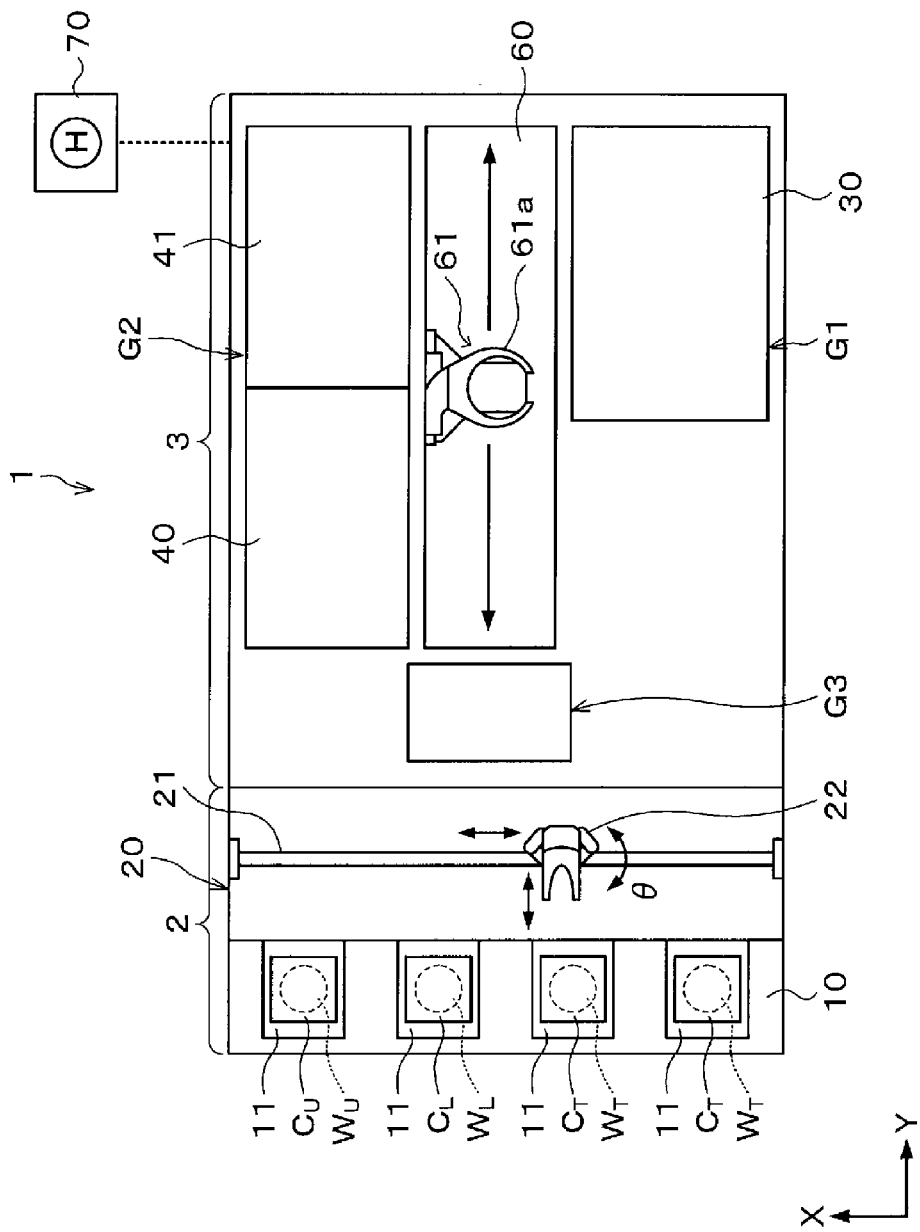
FIG. 1 is a plan view schematically illustrating a configuration of a bonding system according to an exemplary embodiment.
Figure 2:
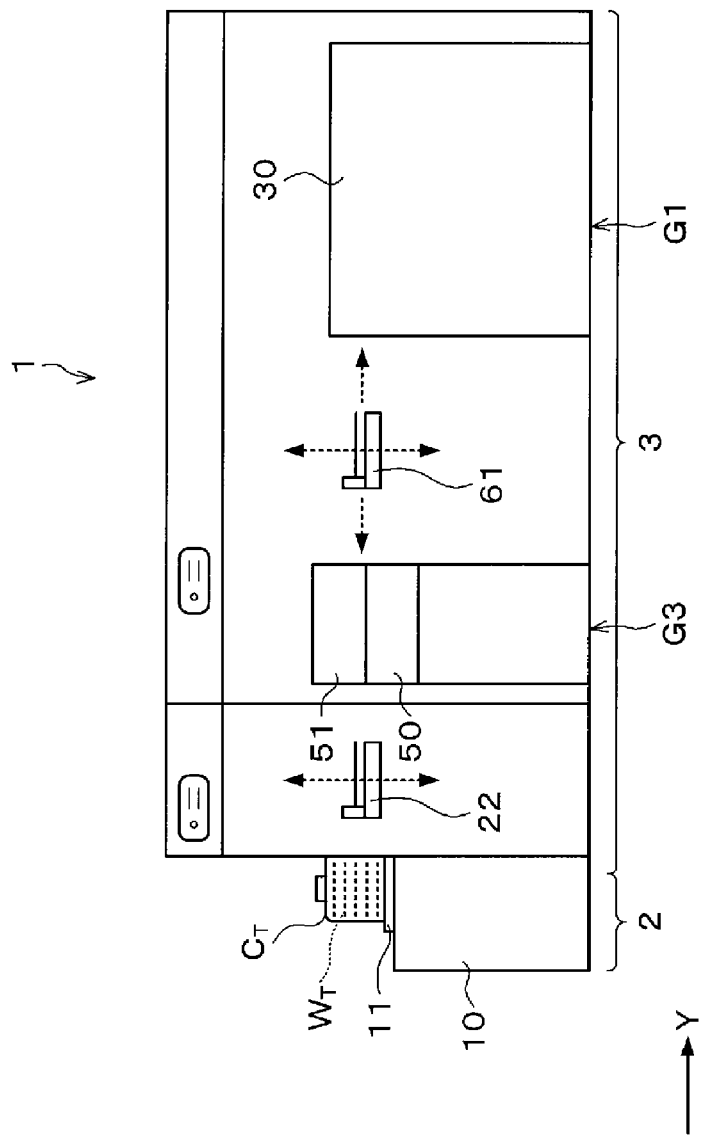
FIG. 2 is a side view schematically illustrating an internal configuration of the bonding system according to the exemplary embodiment.

First, a configuration of a bonding system according to an exemplary embodiment will be discussed. FIG. 1 is a plan view schematically illustrating a configuration of a bonding system 1. FIG. 2 is a side view schematically illustrating an internal configuration of the bonding system 1.

Figure 3:
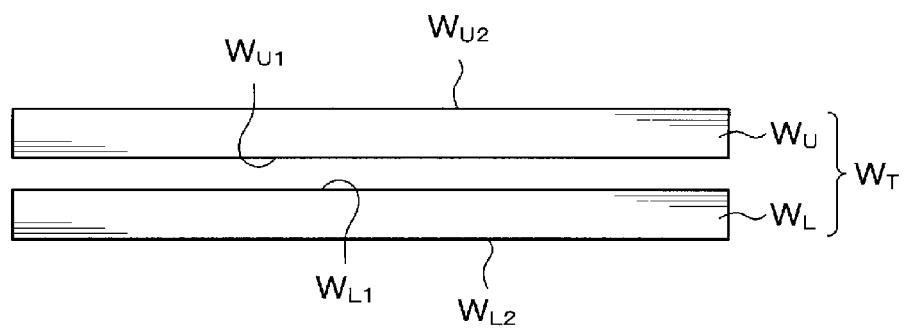
FIG. 3 is a side view schematically illustrating a configuration of an upper wafer and a lower wafer.

In the bonding system 1, two sheets of wafers $W_U$ and $W_L$ as substrates are bonded, for example, as shown in FIG. 3. Hereinafter, a wafer placed at an upper side is referred to as "upper wafer $W_U$" as a first substrate, and a wafer placed at a lower side is referred to as "lower wafer $W_L$" as a second substrate. Further, in surfaces of the upper wafer $W_U$, a bonding surface to be bonded is referred to as "front surface $W_{U1}$," and a surface opposite to the front surface $W_{U1}$ is referred to as "rear surface $W_{U2}$." Likewise, in surfaces of the lower wafer $W_L$, a bonding surface to be bonded is referred to as "front surface $W_{L1}$," and a surface opposite to the front surface $W_{L1}$ is referred to as "rear surface $W_{L2}$." In the bonding system 1, a combined wafer $W_T$ as a combined substrate is formed by bonding the upper wafer $W_U$ and the lower wafer $W_L$.

The bonding system 1 is equipped with, as depicted in FIG. 1, a carry-in/out station 2 and a processing station 3 connected as a single body. The carry-in/out station 2 is configured to carry cassettes $C_U$, $C_L$ and $C_T$, which accommodates therein a plurality of wafers $W_U$, a plurality of wafers $W_L$ and a plurality of combined wafers $W_T$, respectively, to/from the outside. The processing station 3 is equipped with various kinds of processing apparatuses configured to perform preset processings on the wafers $W_U$ and $W_L$ and the combined wafer $W_T$.

The carry-in/out station 2 includes a cassette placing table 10. The cassette placing table 10 is equipped with a multiple number of, for example, four cassette placing plates 11. The cassette placing plates 11 are arranged in a horizontal X direction (up-and-down direction of FIG. 1). When the cassettes $C_U$, $C_L$, $C_T$ are carried to/from the outside of the bonding system 1, the cassettes $C_U$, $C_L$, $C_T$ are placed on these cassette placing plates 11. In this way, the carry-in/out station 2 is configured to be capable of holding a multiple number of upper wafers $W_U$, a multiple number of lower wafers $W_L$ and a multiple number of combined wafers $W_T$. Further, the number of the cassette placing tables 11 is not limited to the example shown in the present exemplary embodiment, and may be set as required. Furthermore, one of the cassettes may be used to collect abnormal wafers. That is, an abnormal combined wafer, which has suffered a problem in bonding between an upper wafer $W_U$ and a lower wafer $W_L$, is separately accommodated in a cassette to be separated from other normal combined wafers $W_T$. In the present exemplary embodiment, one of the cassettes $C_T$ is used for the collection of the abnormal wafers, and other cassettes $C_T$ are used for the accommodation of the normal combined wafers $W_T$.

The carry-in/out station 2 is equipped with a wafer transfer section 20 adjacent to the cassette placing table 10. Provided in the wafer transfer section 20 is a wafer transfer device 22 configured to be movable along a transfer path 21 which is extended in the X direction. The wafer transfer device 22 is configured to be movable in a vertical direction and pivotable around a vertical axis (θ direction). The transfer device 22 is configured to transfer the wafers $W_U$ and $W_L$ and the combined wafer $W_T$ between the cassettes $C_U$, $C_L$ and $C_T$ placed on the cassette placing plates 11 and transition devices 50 and 51 of a third processing block G3 of the processing station 3 to be described later.

A multiple number of, for example, three processing blocks G1, G2 and G3 equipped with various kinds of apparatuses are provided in the processing station 3. For example, the first processing block G1 is provided at a front side (negative X-directional side of FIG. 1) of the processing station 3, and the second processing block G2 is provided at a rear side (positive X-directional side of FIG. 1) of the processing station 3. Further, the third processing block G3 is provided near the carry-in/out station 2 (at a negative Y direction side of FIG. 1) of the processing station 3.

Provided in the first processing block G1 is a surface modifying apparatus 30 configured to modify the surfaces $W_{U1}$ and $W_{L1}$ of the wafers $W_U$ and $W_L$. In the surface modifying apparatus 30, an oxygen gas or a nitrogen gas as a processing gas is formed into plasma under a decompressed atmosphere to be ionized. These oxygen ions or nitrogen ions are irradiated to the surfaces $W_{U1}$ and $W_{L1}$ of the wafers $W_U$ and $W_L$, so the surfaces $W_{U1}$ and $W_{L1}$ are plasma-processed to be modified.

By way of example, in the second processing block G2, a surface hydrophilizing apparatus 40 and a bonding apparatus 41 are arranged in a horizontal Y direction in this sequence from the carry-in/out station 2. The surface hydrophilizing apparatus 40 is configured to hydrophilize and clean the surfaces $W_{U1}$ and $W_{L1}$ of the wafers $W_U$ and $W_L$ with, for example, pure water. The bonding apparatus 41 is configured to bond the wafers $W_U$ and $W_L$. A configuration of the bonding apparatus 41 will be elaborated later.

In this surface hydrophilizing apparatus 40, while rotating the wafer $W_U$ ($W_L$) held by, for example, a spin chuck, the pure water is supplied onto the corresponding wafer $W_U$ ($W_L$). The supplied pure water is diffused on the surface $W_{U1}$ ($W_{L1}$) of the wafer $W_U$ ($W_L$), so that the surface $W_{U1}$ ($W_{L1}$) is hydrophilized.

By way of example, in the third processing block G3, the transition devices 50 and 51 for the wafers $W_U$ and $W_L$ and the combined wafer $W_T$ are arranged in two levels in this order from the bottom, as illustrated in FIG. 2.

Further, as illustrated in FIG. 1, a wafer transfer region 60 is formed in an area surrounded by the first processing block G1 to the third processing block G3. For example, a wafer transfer device 61 is disposed in the wafer transfer region 60.

The wafer transfer device 61 is equipped with, for example, a transfer arm 61a which is configured to be movable in a vertical direction and a horizontal direction (Y direction and X direction) and pivotable around a vertical axis. The wafer transfer device 61 is moved within the wafer transfer region 60 and transfers the wafers $W_U$ and $W_L$ and the combined wafer $W_T$ into preset apparatuses within the first processing block G1, the second processing block G2 and the third processing block G3 which are adjacent to the wafer transfer region 60.

As depicted in FIG. 1, the bonding system 1 is equipped with a controller 70. The controller 70 may be implemented by, for example, a computer and includes a program storage (not shown). The program storage stores therein programs for controlling processings on the wafers $W_U$ and $W_L$ and the combined wafer $W_T$ in the bonding system 1. Further, the program storage also stores therein programs for controlling operations of the aforementioned various kinds of the processing apparatuses and a driving system such as the transfer devices to thereby allow a wafer bonding processing to be described later to be performed in the bonding system 1. Further, the programs are stored in, for example, a computer-readable recording medium H such as a hard disk (HD), a flexible disk (FD), a compact disk (CD), a magnet optical disk (MO) or a memory card, and may be installed to the controller 70 from the recording medium H.

<2. Configuration of Bonding Apparatus>

Now, a configuration of the bonding apparatus 41 will be explained.

<2-1. Overall Configuration of Bonding Apparatus>

Figure 4:
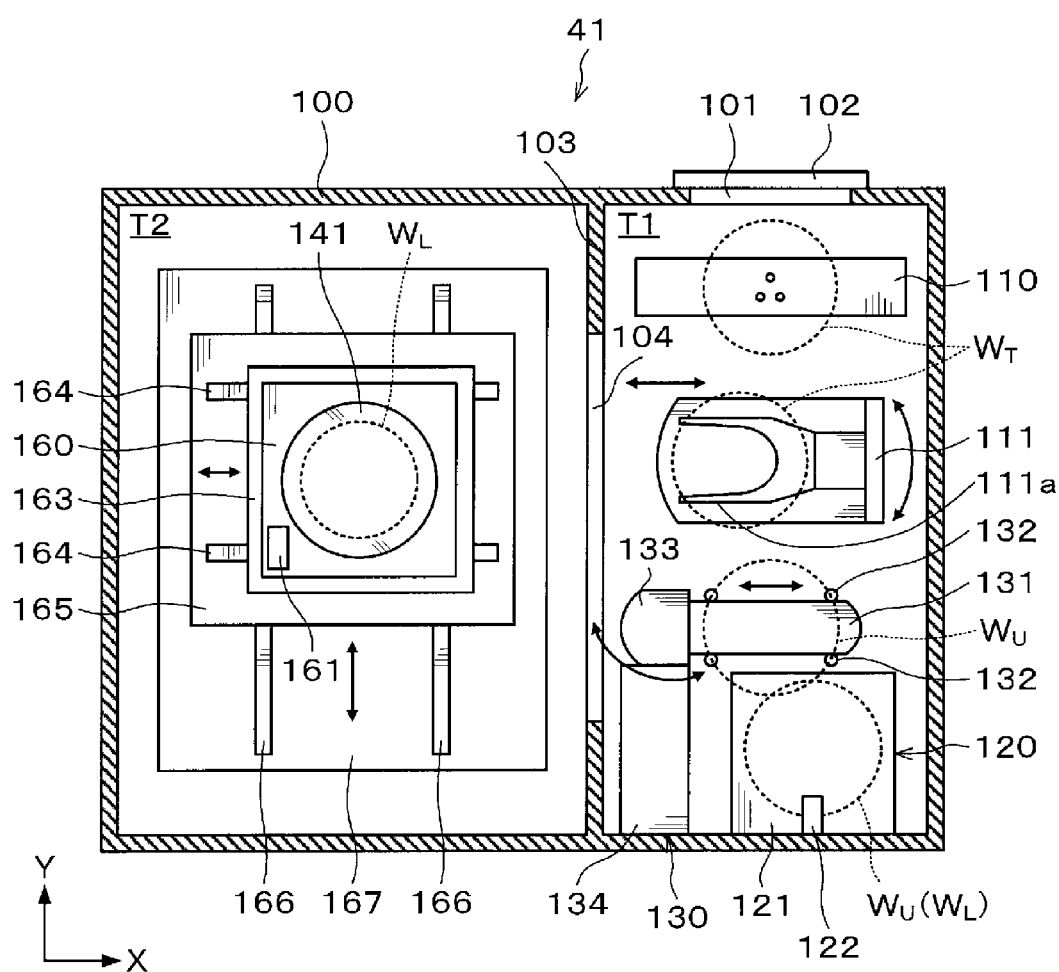
FIG. 4 is a transversal cross sectional view schematically illustrating a configuration of a bonding apparatus.

As depicted in FIG. 4, the bonding apparatus 41 includes a processing chamber 100 having a hermetically sealable inside. A carry-in/out opening 101 for the wafers $W_U$ and $W_L$ and the combined wafer $W_T$ is formed at a lateral side of the processing vessel 100 on the side of the wafer transfer region 60. An opening/closing shutter 102 for the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed at the lateral side of the processing vessel 100 in the transfer region T1. Further, the inner wall 103 is also provided with a carry-in/out opening 104 for the wafers $W_U$ and $W_L$ and the combined wafer $W_T$.

A transition 110 configured to temporarily place thereon the wafers $W_U$ and W and the combined wafer $W_T$ is provided at a positive Y-directional side of the transfer region T1. The transition 110 has, for example, two levels and is capable of holding any two of the wafers $W_U$ and $W_L$ and the combined wafer $W_T$ at the same time.

Figure 5:
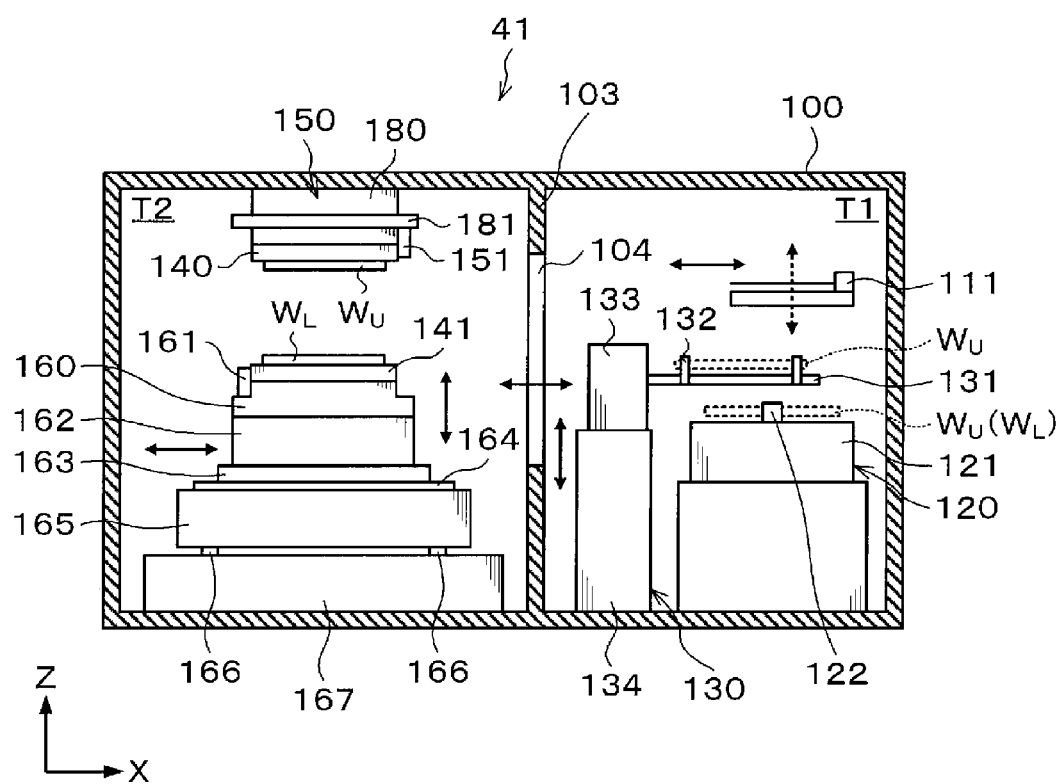
FIG. 5 is a longitudinal cross sectional view schematically illustrating the configuration of the bonding apparatus.

A wafer transfer device 111 is provided within the transfer region T1. The wafer transfer device 111 is equipped with a transfer arm 111a configured to be movable in the vertical direction and the horizontal direction (X direction and Y direction) and also pivotable around a vertical axis, as shown in FIG. 4 and FIG. 5. The wafer transfer device 111 is capable of transferring the wafers $W_U$ and $W_L$ and the combined wafer $W_T$ within the transfer region T1 or between the transfer region T1 and the processing region T2.

A position adjusting device 120 configured to adjust a direction of the wafers $W_U$ and $W_L$ in the horizontal direction is provided at a negative Y-directional side of the transfer region T1. The position adjusting device 120 includes: a base 121 equipped with a holder (not shown) configured to hold and rotate the wafer $W_U$ ($W_L$); and a detector 122 configured to detect a position of a notch of the wafer $W_U$ ($W_L$). The position adjusting device 120 adjusts the position of the notch of the wafer $W_U$ ($W_L$) by detecting the position of the notch with the detector 122 while rotating the wafer $W_U$ ($W_L$) held by the base 121. Accordingly, the horizontal positions of the wafer $W_U$ ($W_L$) is adjusted. Further, a structure configured to hold the wafer $W_U$ ($W_L$) in the base 121 is not particularly limited. By way of non-limiting example, various structures such as a pin chuck structure or a spin chuck structure may be utilized.

Furthermore, an inverting device 130 configured to invert a front surface and a rear surface of the upper wafer $W_U$ is provided in the transfer region T1. The inverting device 130 is equipped with a holding arm 131 configured to hold the upper wafer $W_U$. The holding arm 131 is extended in the horizontal direction (X direction). Further, the holding arm 131 is provided with holding members 132 respectively arranged at four positions. The holding members 132 are configured to hold the upper wafer $W_U$.

The holding arm 131 is supported by a driver 133 including, for example, a motor or the like. The holding arm 131 is configured to be rotatable around a horizontal axis by the driver 133. Further, the holding arm 131 is rotatable around the driver 133 and movable in the horizontal direction (X direction). Another driver (not shown) including, for example, a motor or the like is provided under the driver 133. The driver 133 can be moved in the vertical direction along a vertically extended supporting column 134 by this another driver. The upper wafer $W_U$ held by the holding members 132 can be rotated around the horizontal axis and can also be moved in the vertical direction and the horizontal direction by the driver 133. Further, the upper wafer $W_U$ held by the holding members 132 can be moved between the position adjusting device 120 and an upper chuck 140 to be described later by being rotated around the driver 133.

The upper chuck 140 and a lower chuck 141 are disposed in the processing region T2. The upper chuck 140 serves as a first holder configured to attract and hold the upper wafer $W_U$ on a bottom surface thereof, and the lower chuck 141 serves as a second holder configured to place the lower wafer $W_L$ on a top surface thereof while attracting and holding the lower wafer $W_L$. The lower chuck 141 is provided under the upper chuck 140 and is configured to be disposed to face the upper chuck 140. That is, the upper wafer $W_U$ held by the upper chuck 140 and the lower wafer $W_L$ held by the lower chuck 141 can be arranged to face each other.

The upper chuck 140 is held by an upper chuck rotator 150 disposed above the upper chuck 140. The upper chuck rotator 150 is configured to rotate the upper chuck 140 around a vertical axis as will be described later. Further, the upper chuck rotator 150 is provided at a ceiling surface of the processing vessel 100.

The upper chuck rotator 150 is equipped with an upper imaging device 151 configured to image the front surface $W_{L1}$ of the lower wafer $W_L$ held by the lower chuck 141. That is, the upper imaging device 151 is disposed adjacent to the upper chuck 140. The upper imaging device 151 may be, by way of example, but not limitation, a CCD camera.

The lower chuck 141 is supported by a lower chuck stage 160 provided under the lower chuck 141. The lower chuck stage 160 is equipped with a lower imaging device 161 configured to image the front surface $W_{U1}$ of the upper wafer $W_U$ held by the upper chuck 140. That is, the lower imaging device 161 is disposed adjacent to the lower chuck 141. The lower imaging device 161 may be, by way of example, but not limitation, a CCD camera.

The lower chuck stage 160 is supported by a first lower chuck mover 162 disposed under the lower chuck stage 160. Further, the first lower chuck mover 162 is supported by a supporting table 163. The first lower chuck mover 162 is configured to move the lower chuck 141 in the horizontal direction (X direction) as will be described later. Moreover, the first lower chuck mover 162 is configured to move the lower chuck 141 in the vertical direction.

The supporting table 163 is fastened to a pair of rails 164 which is disposed at a bottom side of the supporting table 163 to be elongated in the horizontal direction (X direction). The supporting table 163 is configured to be movable along the rails 164 by the first lower chuck mover 162. Further, the first lower chuck mover 162 is moved by, for example, a linear motor (not shown) provided along the rails 164.

The rails 164 are provided at a second lower chuck mover 165. The second lower chuck mover 165 is fastened to a pair of rails 166 which is provided at a bottom side of the second lower chuck mover 165 to be elongated in the horizontal direction (Y direction). The second lower chuck mover 165 is configured to be movable along the rails 166, that is, to move the lower chuck 141 in the horizontal direction (Y direction). The second lower chuck mover 165 is moved by, for example, a linear motor (not shown) provided along the rails 166. The rails 166 are disposed on a placing table 167 provided at a bottom surface of the processing vessel 100.

Further, in the present exemplary embodiment, the first lower chuck mover 162 and the second lower chuck mover 165 constitutes a moving device of the present disclosure.

<2-2. Configuration of Upper Chuck and Upper Chuck Rotator>

Now, a detailed configuration of the upper chuck 140 and the upper chuck rotator 150 of the bonding apparatus 41 will be described.

Figure 6:
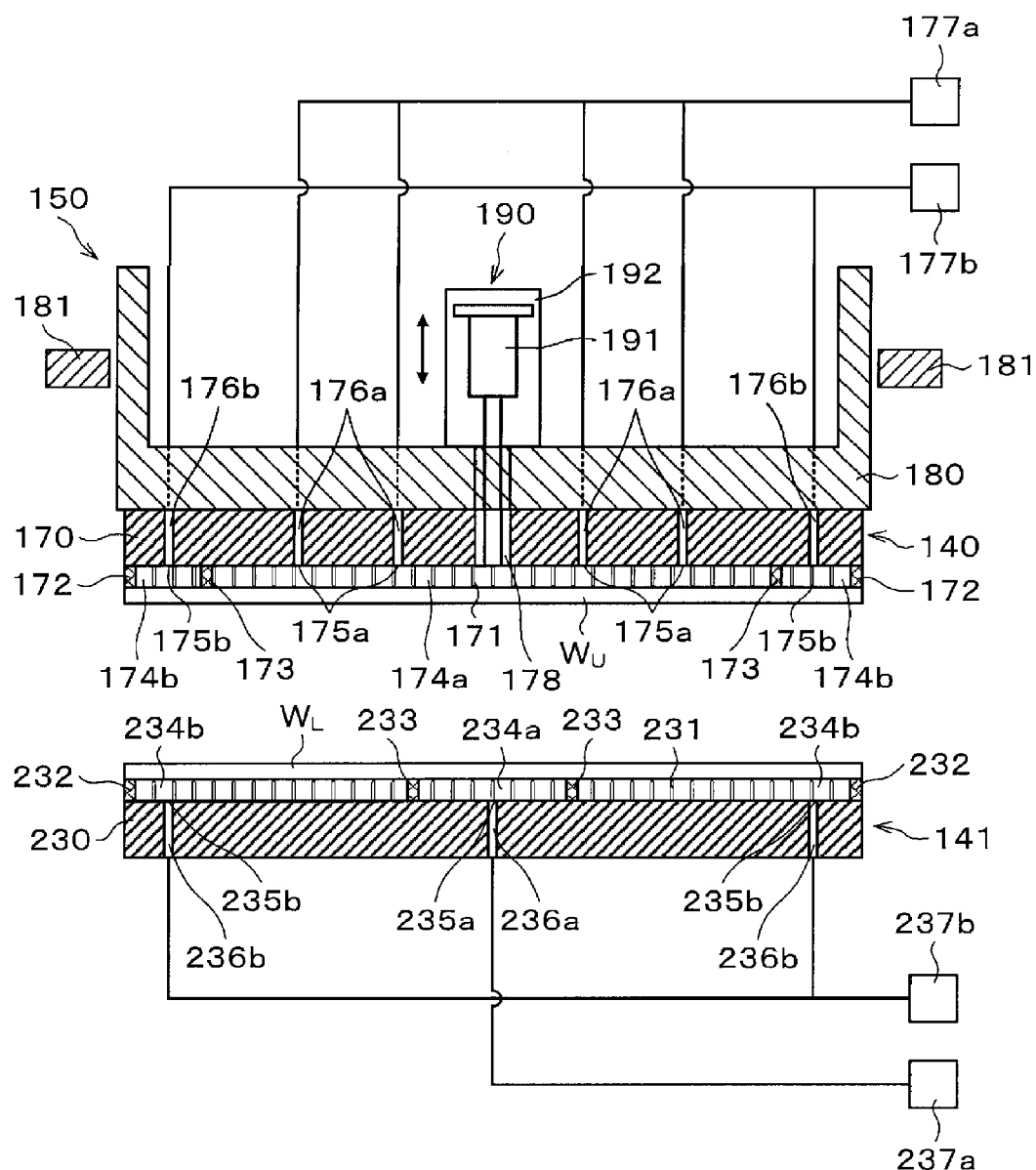
FIG. 6 is a longitudinal cross sectional view schematically illustrating an upper chuck, an upper chuck rotator and a lower chuck.

The upper chuck 140 is of a pin chuck type, as shown in FIG. 6. The upper chuck 140 has a main body 170 having a diameter larger than a diameter of the upper wafer $W_U$ when viewed from the top. A plurality of pins 171 configured to be brought into contact with the rear surface $W_{U2}$ of the upper wafer $W_U$ is provided at a bottom surface of the main body 170. Further, an outer rib 172 having the same height as the pins 171 and configured to support a periphery of the rear surface $W_{U2}$ of the upper wafer $W_U$ is provided at a periphery of the bottom surface of the main body 170. The outer rib 172 is annularly formed at an outside of the pins 171.

Further, an inner rib 173 having the same height as the pins 171 and configured to support the rear surface $W_{U2}$ of the upper wafer $W_U$ is provided at an inside of the outer rib 172 on the bottom surface of the main body 170. The inner rib 173 is formed in a ring shape to be concentric with the outer rib 172. A region 174 inside the outer rib 172 (hereinafter, sometimes referred to as "suction region 174") is partitioned into a first suction region 174a inside the inner rib 173 and a second suction region 174b outside the inner rib 173.

First suction openings 175a for vacuum-exhausting the upper wafer $W_U$ in the first suction region 174a are formed at the bottom surface of the main body 170. The first suction openings 175a are formed at, for example, four positions in the first suction region 174a. The first suction openings 175a are connected to first suction lines 176a which are provided within the main body 170. Further, the first suction lines 176a are connected with a first vacuum pump 177a.

In addition, second suction openings 175b for vacuum-exhausting the upper wafer $W_U$ in the second suction region 174b are formed at the bottom surface of the main body 170. The second suction openings 175b are formed at, for example, two positions within the second suction region 174b. The second suction openings 175b are connected to second suction lines 176b provided within the main body 170. Further, the second suction lines 176b are connected with a second vacuum pump 177b.

By vacuum-exhausting the suction regions 174a and 174b formed by being surrounded by the upper wafer $W_U$, the main body 170 and the outer rib 172 through the suction openings 175a and 175b, respectively, the suction regions 174a and 174b are decompressed. At this time, since an atmosphere at the outside of the suction regions 174a and 174b is under an atmospheric pressure, the upper wafer $W_U$ is pressed toward the suction regions 174a and 174b by the atmospheric pressure as much as a decompressed amount, so that the upper wafer $W_U$ is attracted to and held by the upper chuck 140. Further, the upper chuck 140 is configured to be capable of vacuum-exhausting the upper wafer $W_U$ through the first suction region 174a and the second suction region 174b individually.

In this case, since the outer rib 172 supports the periphery of the rear surface $W_{U2}$ of the upper wafer $W_U$, the upper wafer $W_U$ is appropriately vacuum-exhausted, including the periphery thereof. Therefore, the entire surface of the upper wafer $W_U$ is attracted to and held by the upper chuck 140, and flatness of the upper wafer $W_U$ can be reduced and the upper wafer $W_U$ can thus be flattened.

Furthermore, since the heights of the pins 171 are uniform, flatness of the bottom surface of the upper chuck 140 can be further reduced. In this way, by flattening the bottom surface (by reducing the flatness of the bottom surface) of the upper chuck 140, the upper wafer $W_U$ held by the upper chuck 140 can be suppressed from suffering from a deformation in the vertical direction.

Further, since the rear surface $W_{U2}$ of the upper wafer $W_U$ is supported by the pins 171, it is easy for the upper wafer $W_U$ to be separated from the upper chuck 140 when releasing the vacuum-exhaust of the upper wafer $W_U$ by the upper chuck 140.

The upper chuck 140 is provided with a through hole 178 which is formed through a center of the main body 170 in a thickness direction of the main body 170. The center of this main body 170 corresponds to a center of the upper wafer $W_U$ held by and attracted to the upper chuck 140. A leading end of the actuator 191 of a pressing member 190 to be described later is inserted through this through hole 178.

Figure 7:
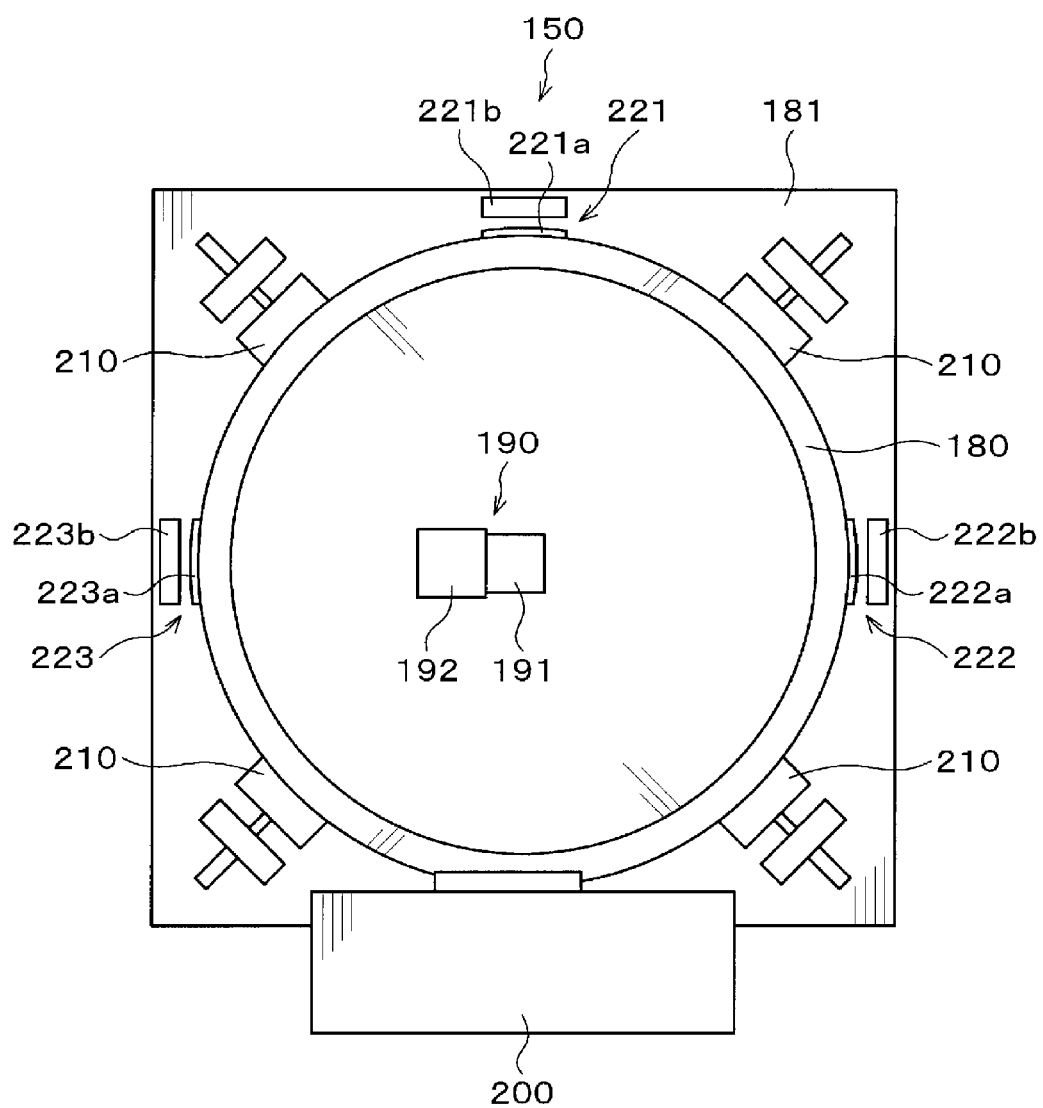
FIG. 7 is a plan view schematically illustrating a configuration of the upper chuck rotator.

The upper chuck rotator 150 is equipped with an upper chuck stage 180 provided on a top surface of the main body 170 of the upper chuck 140 and configured to hold the upper chuck 140, as depicted in FIG. 6 and FIG. 7. The upper chuck stage 180 has an open top and has a hollow cylindrical shape. When viewed from the top, the upper chuck stage 180 has the substantially same shape as the main body 170. Provided at an outer circumferential surface of the upper chuck stage 180 is a supporting member 181 configured to support the upper chuck stage 180 and mounted to the ceiling surface of the processing vessel 100. A slight gap is formed between the outer circumferential surface of the upper chuck stage 180 and an inner circumferential surface of the supporting member 181.

The pressing member 190 configured to press the center of the upper wafer $W_U$ is provided on a bottom surface within the upper chuck stage 180. The pressing member 190 has the actuator 191 and a cylinder 192.

The actuator 191 is configured to generate a constant pressure in a certain direction by air supplied from an electro-pneumatic regulator (not shown), and is capable of generating the pressure constantly regardless of a position of a point of application of the pressure. The actuator 191 is capable of controlling a pressing load applied to the center of the upper wafer $W_U$ by the air from the electro-pneumatic regulator while the actuator 191 comes into contact with the center of the upper wafer $W_U$. Further, the leading end of the actuator 191 is vertically movable up and down through the through hole 178 by the air from the electro-pneumatic regulator.

The actuator 191 is supported by the cylinder 192. The cylinder 192 is capable of moving the actuator 191 in the vertical direction by a driver having, for example, a motor embedded therein.

As stated above, the pressing member 190 controls the pressing load with the actuator 191 and controls the movement of the actuator 191 with the cylinder 192. The pressing member 190 is capable of pressing the center of the upper wafer $W_U$ and a center of the lower wafer $W_L$ when bonding of the wafers $W_U$ and $W_L$ to be described later is performed.

The supporting member 181 is equipped with, as depicted in FIG. 7, a rotating device 200 configured to rotate the upper chuck stage 180 (and the upper chuck 140). The rotating device 200 is in contact with the outer circumferential surface of the upper chuck stage 180 and is capable of rotating the upper chuck state 180 with a driver which has, for example, a motor embedded therein.

Further, the supporting member 181 is provided with fixing parts 210 configured to hold the upper chuck stage 180 in place. The fixing parts 210 are equi-spaced at four positions along the outer circumferential surface of the upper chuck stage 180. Each fixing part 210 blows air toward the outer circumferential surface of the upper chuck stage 180, thus achieves centering of the upper chuck stage 180 and holds the upper chuck stage 180 in place.

Further, the supporting member 181 is equipped with linear scales 221 to 223 as position measurement devices each configured to measure a position of the upper chuck stage 180, that is, a position of the upper chuck 140. The linear scales 221 to 223 include scales 221a to 223a provided at the outer circumferential surface of the upper chuck stage 180 and detection heads 221b to 223b configured to read the scales 221a to 223a, respectively. Further, for the measuring method of the position of the upper chuck 140 by the linear scales 221 to 223, a commonly known method may be utilized.

In the three linear scales 221 to 223, the first linear scale 221 is disposed to face the rotating device 200 on a central line of the upper chuck stage 180. Further, the second linear scale 222 and the third linear scale 223 are disposed at positions where they form a central angle of 90 degrees with respect to the first linear scale 221, and are disposed to face each other on the central line of the upper chuck stage 180. That is, a distance between the first linear scale 221 and the second linear scale 222 and a distance between the first linear scale 221 and the third linear scale 223 are same.

Furthermore, through the linear scale is used as the position measurement device in the present exemplary embodiment, the position measurement device is not limited thereto as long as it is capable of measuring the position of the upper chuck 140. By way of non-limiting example, a displacement meter may be used as the position measurement device.

<2-3. Position Adjustment of Upper Chuck>

The first linear scale 221 is connected to a servo amplifier (not shown), and the servo amplifier is connected to the controller 70. That is, the first linear scale 221 is used for a servo control (full close control), and a measurement result of the first linear scale 221 is used to adjust a position of the upper chuck 140 in the rotational direction (θ direction) around the vertical axis thereof, as will be described later.

Further, the second linear scale 222 and the third linear scale 223 are respectively connected to the controller 70. Measurement results of the three linear scales 221 to 223 are used to adjust a position of the upper chuck 140 in the horizontal direction (X direction and Y direction) as will be described later, and also used, when required, to adjust the position of the upper chuck 140 in the rotational direction (θ direction). To elaborate, to adjust these positions of the upper chuck 140, the eccentric amount (deviation amount)

of the upper chuck 140 with respect to the lower chuck 141 is calculated from the measurement results of the three linear scales 221 to 223.

Figure 8:
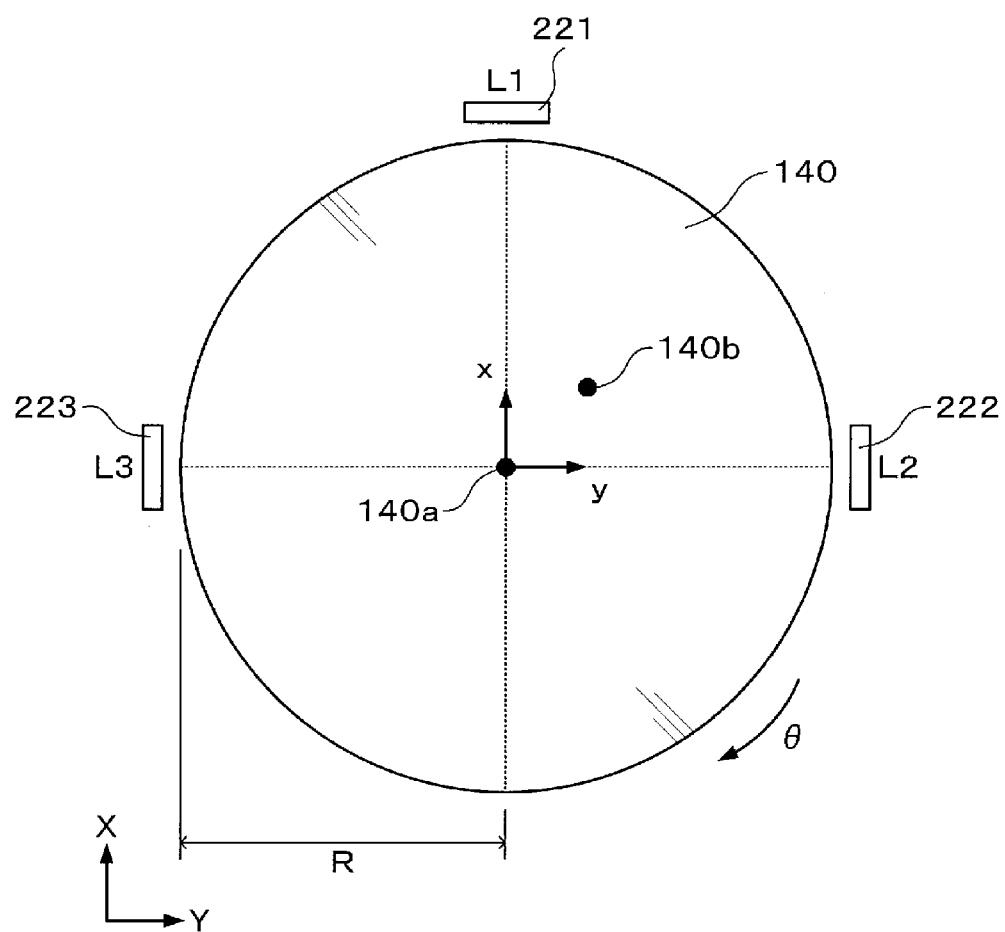
FIG. 8 is an explanatory diagram showing individual dimensions when calculating an eccentric amount of the upper chuck with respect to the lower chuck.

Here, a method of calculating the aforementioned eccentric amount of the upper chuck 140 will be explained. FIG. 8 is an explanatory diagram showing dimensions required to calculate the eccentric amount of the upper chuck 140. In FIG. 8, a reference numeral 140a refers to a center point of the upper chuck 140 which is not eccentric, that is, located at a right position, and a reference numeral 140b indicates a center point of the upper chuck 140 which is eccentric. Measurement results L1 to L3 of the three linear scales 221 to 223 are respectively represented by the following expressions (1) to (3). Further, the measurement results L1 to L3 of the linear scales 221 to 223 are encoder values (absolute values) counted up in the clockwise direction.

$$L1 = y + R\theta \quad (1)$$

$$L2 = -x + R\theta \quad (2)$$

$$L3 = x + R\theta \quad (3)$$

L1: An encoder value of the first linear scale 221
L2: An encoder value of the second linear scale 222
L3: An encoder value of the third linear scale 223
x: An eccentric amount of the upper chuck 140 with respect to the lower chuck 141 in X direction
y: An eccentric amount of the upper chuck 140 with respect to the lower chuck 141 in Y direction
θ: An eccentric amount (rotation amount) of the upper chuck 140 with respect to the lower chuck 141
R: Radius of the upper chuck 140

If the expressions (1) to (3) are organized with respect to x, y and θ, the following expressions (4) to (6) are derived.

$$x = (L3 - L2)/2 \quad (4)$$

$$y = L1 - (L3 + L2)/2 \quad (5)$$

$$\theta = (L3 + L2)/2R \quad (6)$$

<2-4. Configuration of Lower Chuck>

Now, a detailed configuration of the lower chuck 141 of the bonding apparatus 41 will be explained.

The lower chuck 141 is of a pin chuck type, the same as the upper chuck 140, as shown in FIG. 6. The lower chuck 141 has a main body 230 having a diameter larger than a diameter of the lower wafer $W_L$ when viewed from the top. A plurality of pins 231 configured to be brought into contact with the rear surface $W_{L2}$ of the lower wafer $W_L$ is provided at a top surface of the main body 230. Further, an outer rib 232 having the same height as the pins 231 and configured to support a periphery of the rear surface $W_{L2}$ of the lower wafer $W_L$ is provided at a periphery of the top surface of the main body 230. The outer rib 232 is annularly formed at an outside of the pins 231.

Further, an inner rib 233 having the same height as the pins 231 and configured to support the rear surface $W_{L2}$ of the lower wafer $W_L$ is provided at an inside of the outer rib 232 on the top surface of the main body 230. The inner rib 233 is formed in a ring shape to be concentric with the outer rib 232. A region 234 inside the outer rib 232 (hereinafter, sometimes referred to as "suction region 234") is partitioned into a first suction region 234a inside the inner rib 233 and a second suction region 234b outside the inner rib 233.

A first suction opening 235a for vacuum-exhausting the lower wafer $W_L$ in the first suction region 234a is formed at the top surface of the main body 230. The first suction opening 235a is formed at, for example, a single position in the first suction region 234a. The first suction opening 235a is connected to a first suction line 236a which is provided within the main body 230. Further, the first suction line 236a is connected with a first vacuum pump 237a.

In addition, second suction openings 235b for vacuum-exhausting the lower wafer $W_L$ in the second suction region 234b are formed at the top surface of the main body 230. The second suction openings 235b are formed at, for example, two positions within the second suction region 234b. The second suction openings 235b are connected to second suction lines 236b provided within the main body 230. Further, the second suction lines 236b are connected with a second vacuum pump 237b.

By vacuum-exhausting the suction regions 234a and 234b formed by being surrounded by the lower wafer $W_L$, the main body 230 and the outer rib 232 through the suction openings 235a and 235b, respectively, the suction regions 234a and 234b are decompressed. At this time, since an atmosphere at the outside of the suction regions 234a and 234b is under the atmospheric pressure, the lower wafer $W_L$ is pressed toward the suction regions 234a and 234b by the atmospheric pressure as much as a decompressed amount, so that the lower wafer $W_L$ is attracted to and held by the lower chuck 141. Further, the lower chuck 141 is configured to be capable of vacuum-exhausting the lower wafer $W_L$ through the first suction region 234a and the second suction region 234b individually.

In this case, since the outer rib 232 supports the periphery of the rear surface $W_{L2}$ of the lower wafer $W_L$, the lower wafer $W_L$ is appropriately vacuum-exhausted, including the periphery thereof. Therefore, the entire surface of the lower wafer $W_L$ is attracted to and held by the lower chuck 141, and flatness of the lower wafer $W_L$ can be reduced and the lower wafer $W_L$ can thus be flattened.

Furthermore, since the heights of the pins 231 are uniform, flatness of the top surface of the lower chuck 141 can be further reduced. In this way, by flattening the top surface (by reducing the flatness of the top surface) of the lower chuck 141, the lower wafer $W_L$ held by the lower chuck 141 can be suppressed from suffering from a deformation in a vertical direction.

Further, since the rear surface $W_{L2}$ of the lower wafer $W_L$ is supported by the pins 231, it is easy for the lower wafer $W_L$ to be separated from the lower chuck 141 when releasing the vacuum-exhaust of the lower wafer $W_L$ by the lower chuck 141.

The lower chuck 141 is provided with through holes (not shown) which are formed in a thickness direction of the main body 230 at, e.g., three positions in the vicinity of a center of the main body 230. Elevating pins provided under the first lower chuck mover 162 are inserted through these through holes.

Guide members (not shown) are provided at a periphery of the main body 230 to suppress each of the wafers $W_U$ and $W_L$ and the combined wafer $W_T$ from falling down by being bounced off or slid off the lower chuck 141. The guide members are equi-spaced at plural positions, for example, four positions at the periphery of the main body 230.

The operations of the individual components of the bonding apparatus 41 are controlled by the aforementioned controller 70.

<3. Bonding Method>

Figure 9:
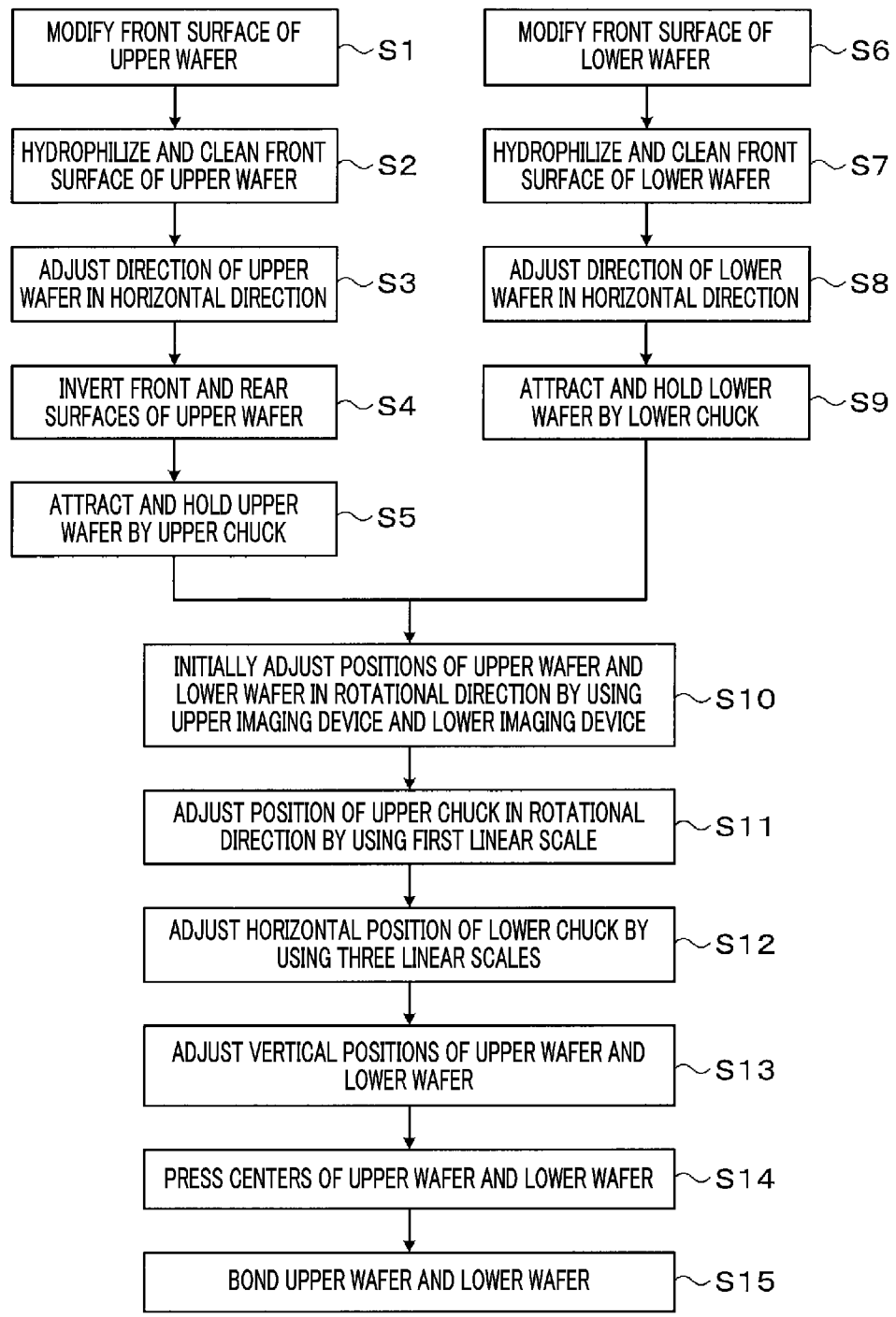
FIG. 9 is a flowchart illustrating major processes of a wafer bonding processing.

Now, a bonding method for the wafers $W_U$ and $W_L$ performed by the bonding system 1 configured as described above will be explained. FIG. 9 is a flowchart illustrating an example of main processes of such a wafer bonding processing.

First, a cassette $C_U$ accommodating the upper wafers $W_U$, a cassette $C_L$ accommodating the lower wafers $W_L$ and an empty cassette $C_T$ are placed on the preset cassette placing plates 11 of the carry-in/out station 2. Then, an upper wafer $W_U$ is taken out of the cassette $C_U$ by the wafer transfer device 22 and is transferred to the transition device 50 of the third processing block G3 of the processing station 3.

Subsequently, the upper wafer $W_U$ is transferred into the surface modifying apparatus 30 of the first processing block G1 by the wafer transfer device 61. In the surface modifying apparatus 30, an oxygen gas or a nitrogen gas as the processing gas is excited into plasma to be ionized under the preset decompressed atmosphere. The oxygen ions or the nitrogen ions are irradiated to the front surface $W_{U1}$ of the upper wafer $W_U$, and the front surface $W_{U1}$ is plasma-processed. As a result, the front surface $W_{U1}$ of the upper wafer $W_U$ is modified (process S1 of FIG. 9).

Then, the upper wafer $W_U$ is transferred into the surface hydrophilizing apparatus 40 of the second processing block G2 by the wafer transfer device 61. In the surface hydrophilizing apparatus 40, pure water is supplied onto the upper wafer $W_U$ while rotating the upper wafer $W_U$ held by the spin chuck. The supplied pure water is diffused on the front surface $W_{U1}$ of the upper wafer $W_U$, and hydroxyl groups (silanol groups) adhere to the front surface $W_{U1}$ of the upper wafer $W_U$ modified in the surface modifying apparatus 30, so that the front surface $W_{U1}$ is hydrophilized. Further, the front surface $W_{U1}$ of the upper wafer $W_U$ is cleaned by the pure water (process S2 of FIG. 9).

Thereafter, the upper wafer $W_U$ is transferred into the bonding apparatus 41 of the second processing block G2 by the wafer transfer device 61. The upper wafer $W_U$ carried into the bonding apparatus 41 is then transferred into the position adjusting device 120 through the transition 110 by the wafer transfer device 111. Then, the direction of the upper wafer $W_U$ in the horizontal direction is adjusted by the position adjusting device 120 (process S3 of FIG. 9).

Then, the upper wafer $W_U$ is delivered onto the holding arm 131 of the inverting device 130 from the position adjusting device 120. Then, in the transfer region T1, by inverting the holding arm 131, the front surface and the rear surface of the upper wafer $W_U$ are inverted (process S4 of FIG. 9). That is, the front surface $W_{U1}$ of the upper wafer $W_U$ is turned to face downwards.

Thereafter, the holding arm 131 of the inverting device 130 is rotated around the driver 133 to be located under the upper chuck 140. The upper wafer $W_U$ is then transferred to the upper chuck 140 from the inverting device 130. The rear surface $W_{U2}$ of the upper wafer $W_U$ is attracted to and held by the upper chuck 140 (process S5 of FIG. 9). To elaborate, by operating the vacuum pumps 177a and 177b, the upper wafer $W_U$ is vacuum-exhausted through the suction openings 175a and 175b in the suction regions 174a and 174b, so that the upper wafer $W_U$ is attracted to and held by the upper chuck 140.

While the above-described processes S1 to S5 are being performed on the upper wafer $W_U$, processings are performed on the lower wafer $W_L$. First, the lower wafer $W_L$ is taken out of the cassette $C_L$ by the wafer transfer device 22 and transferred into the transition device 50 of the processing station 3.

Subsequently, the lower wafer $W_L$ is transferred into the surface modifying apparatus 30 by the wafer transfer device 61, and the front surface $W_{L1}$ of the lower wafer $W_L$ is modified (process S6 of FIG. 9). Further, the modification of the front surface $W_{L1}$ of the lower wafer $W_L$ in the process S6 is the same as the above-described process S1.

Thereafter, the lower wafer $W_L$ is transferred into the surface hydrophilizing apparatus 40 by the wafer transfer device 61, so that the front surface $W_{L1}$ of the lower wafer $W_L$ is hydrophilized and cleaned (process S7 of FIG. 9). The hydrophilizing and the cleaning of the front surface $W_{L1}$ of the lower wafer $W_L$ in the process S7 are the same as those in the above-described process S2.

Afterwards, the lower wafer $W_L$ is transferred into the bonding apparatus 41 by the wafer transfer device 61. The lower wafer $W_L$ carried into the bonding apparatus 41 is transferred into the position adjusting device 120 through the transition 110 by the wafer transfer device 111. Then, the direction of the lower wafer $W_L$ in the horizontal direction is adjusted by the position adjusting device 120 (process S8 of FIG. 9).

Then, the lower wafer $W_L$ is transferred onto the lower chuck 141 by the wafer transfer device 111, and the rear surface $W_{L2}$ is attracted to and held by the lower chuck 141 (process S9 of FIG. 9). To elaborate, by operating the vacuum pumps 237a and 237b, the lower wafer $W_L$ is vacuum-exhausted through the suction openings 235a and 235b in the suction regions 234a and 234b, so that the lower wafer $W_L$ is attracted to and held by the lower chuck 141.

Subsequently, the position adjustment of the upper wafer $W_U$ held by the upper chuck 140 and the lower wafer $W_L$ held by the lower chuck 141 is performed.

First, initial adjustment of the positions of the upper wafer $W_U$ and the lower wafer $W_L$ in the rotational direction (horizontal direction) is performed by using the upper imaging device 151 and the lower imaging device 161. To elaborate, the lower chuck 141 is moved in the horizontal direction (X direction and Y direction) by the first lower chuck mover 162 and the second lower chuck mover 165, and preset reference points (for example, two points at a periphery) on the front surface $W_{L1}$ of the lower wafer $W_L$ are imaged in sequence by using the upper imaging device 151. Concurrently, preset reference points (for example, two points at a periphery) on the front surface $W_{U1}$ of the upper wafer $W_U$ are imaged in sequence by using the lower imaging device 161. The obtained images are outputted to the controller 70. Based on the images obtained by the upper imaging device 151 and the lower imaging device 161, the controller 70 rotates the upper chuck 140 by the rotating device 200 to a position where the reference points of the upper wafer $W_U$ and the lower wafer $W_L$ are overlapped, that is, where the directions of the upper wafer $W_U$ and the lower wafer $W_L$ become identical. In this way, the positions of the upper wafer $W_U$ and the lower wafer $W_L$ in the rotational direction are initially adjusted (process S10 of FIG. 9).

Here, the position adjustment using the upper imaging device 151 and the lower imaging device 161 is performed only in this process S10, and the position adjustments in the subsequent processes S11 and S12 are performed by using the linear scales 221 to 223 as will be described later. Particularly, in the process S11, though the position of the upper chuck 140 in the rotational direction is adjusted by using the first linear scale 221, initial states of the upper wafer $W_U$ held by the upper chuck 140 and the lower wafer $W_L$ held by the lower chuck 141 in the rotational direction cannot be observed with the first linear scale 221. For this reason, in the aforementioned process S10, the positions of the upper wafer $W_U$ and the lower wafer $W_L$ in the rotational direction are initially adjusted.

After the process S10, the position of the upper chuck 140 is measured by using the first linear scale 221. The measurement result of the first linear scale 221, that is, the encoder value L1 of the first linear scale 221 is outputted to the controller 70. The controller 70 calculates a correction amount for the upper chuck 140 in the rotational direction based on the encoder value L1 of the first linear scale 221 such that an eccentric amount θ of the upper chuck 140 with respect to the lower chuck 141 in the rotational direction falls within a preset threshold value, e.g., ±0.2 μrad. Then, the controller 70 controls the rotating device 200 based on this correction amount. As the upper chuck 140 is rotated by the rotating device 200 as much as the correction amount, the position of the upper chuck 140 with respect to the lower chuck 141 in the rotational direction is adjusted (process S11 of FIG. 9).

In the process S11, the first linear scale 221 spaced farthest from the rotating device 200 is used. By way of example, if the upper chuck 140 and the lower chuck 141 are deviated from each other in the rotational direction, an influence of this deviation is largely reflected in this encoder value L1 of the first linear scale 221 as compared to an encoder value L2 of the second linear scale 222 or an encoder value L3 of the third linear scale 223, for example. Accordingly, the position of the upper chuck 140 in the rotational direction can be adjusted more appropriately.

Further, in the process S11, when rotating the upper chuck 140 by the rotating device 200, the upper chuck stage 180 is centered by the fixing parts 210.

In addition, in the process S11, the rotating device 200 may be controlled such that the eccentric amount θ of the upper chuck 140 in the rotational direction becomes zero. Further, if the encoder value L1 of the first linear scale 221 is found to fall within a preset threshold value as a result of the measurement by the first linear scale 221, it may not be required to rotate the upper chuck 140 with the rotating device 200.

In the above-described process S11, when rotating the upper chuck 140 by the rotating device 200, a center point (rotation axis) of the upper chuck 140 may be deviated from the center point 140a to the center point 140b in the horizontal direction, as shown in FIG. 8. By way of example, in case that the control accuracy of the rotating device 200 is low, the center point of the upper chuck 140 is deviated in the horizontal direction. Further, though the upper chuck 140 is centered by the air from the four fixing parts 210, the center point of the upper chuck 140 may be deviated in the horizontal direction depending on the air balance from these fixing parts 210.

Thus, the horizontal position of the upper chuck 140 is then adjusted. To elaborate, the position of the upper chuck 140 is first measured by using the three linear scales 221 to 223. The measurement results of the three linear scales 221 to 223, that is, the encoder values L1 to L3 of the three linear scales 221 to 223 are outputted to the controller 70. Based on the encoder values L1 to L3 of the linear scales 221 to 223, the controller 70 calculates eccentric amounts x, y and θ of the upper chuck 140 with respect to the lower chuck 141 in the X direction, the Y direction and the θ direction, respectively, from the following expressions (4) to (6).

$$x=(L3-L2)/2 \quad (4)$$

$$y=L1-(L3+L2)/2 \quad (5)$$

$$\theta=(L3+L2)/2R \quad (6)$$

Further, the controller 70 calculates the correction amounts for the upper chuck 140 in the horizontal direction (X direction and Y direction) such that the eccentric amount x of the upper chuck 140 in the X direction and the eccentric amount y of the upper chuck 140 in the Y direction fall within a preset threshold value, e.g., 1 μm. Then, the controller 70 controls the first lower chuck mover 162 and the second lower chuck mover 165 based on these correction amounts. As the upper chuck 140 is moved by the first lower chuck mover 162 and the second lower chuck mover 165 as much as the correction amounts, the position of the upper chuck 140 with respect to the lower chuck 141 in the horizontal direction is adjusted (process S12 of FIG. 9).

In the process S12, since the distance between the first linear scale 221 and the second linear scale 222 is equal to the distance between the first linear scale 221 and the third linear scale 223, simple expressions such as the aforementioned expressions (4) to (6) may be used. Here, if these distances are different, an equation for calculating the eccentric amounts of the upper chuck 140 would be complicated, resulting in a complicated control as well. In the present exemplary embodiment, the horizontal position of the upper chuck 140 can be adjusted through the simple control.

Furthermore, in the process S12, the first lower chuck mover 162 and the second lower chuck mover 165 may be controlled such that the eccentric amount x of the upper chuck 140 in the X direction and the eccentric amount y of the upper chuck 140 in the Y direction both become zero. Further, if each of the encoder values L1 to L3 of the linear scales 221 to 223 falls within the preset threshold value as a result of the measurement by the three linear scales 221 to 223, it is not needed to move the upper chuck 140 in the horizontal direction by the first lower chuck mover 162 and the second lower chuck mover 165.

Moreover, in the process S12 of the present exemplary embodiment, the position of the upper chuck 140 in the horizontal direction is adjusted. By way of example, if the eccentric amount θ of the upper chuck 140 in the rotational direction calculated from the expression (6) does not fall within the preset threshold value, e.g., ±0.2 μrad, the position of the upper chuck 140 in the rotational direction may be further adjusted. To be specific, in the controller 70, the correction amount for the upper chuck 140 in the rotational direction is calculated based on the eccentric amount θ of the upper chuck 140 in the rotational direction. Then, the upper chuck 140 is rotated by the correction amount with the rotating device 200, so that the position of the upper chuck 140 with respect to the lower chuck 141 in the rotational direction is adjusted.

By performing the above-stated processes S10 to S12, the position adjustment between the upper chuck 140 and the lower chuck 141 is performed, and the positions of the upper wafer $W_U$ held by the upper chuck 140 and the lower wafer $W_L$ held by the lower chuck 141 in the rotational direction and the horizontal direction are adjusted.

Thereafter, by moving the lower chuck 141 vertically upwards by the first lower chuck mover 162, the position adjustment between the upper chuck 140 and the lower chuck 141 in the vertical direction is performed, so that the position adjustment between the upper wafer $W_U$ held by the upper chuck 140 and the lower wafer $W_L$ held by the lower chuck 141 in the vertical direction is carried out (process S13 of FIG. 9). Then, the upper wafer $W_U$ and the lower wafer $W_L$ are located at the preset positions while facing each other.

Subsequently, a bonding processing of bonding the upper wafer $W_U$ held by the upper chuck 140 and the lower wafer $W_L$ held by the lower chuck 141 is performed.

Figure 10:
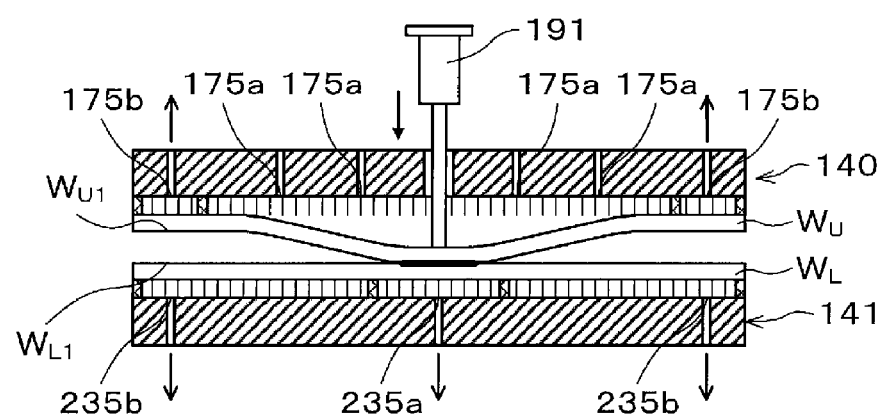
FIG. 10 is an explanatory diagram illustrating a state in which a center of the upper wafer and a center of the lower wafer are pressed to be brought into contact with each other.

First, as depicted in FIG. 10, the actuator 191 is lowered by the cylinder 192 of the pressing member 190. As the actuator 191 is moved down, the center of the upper wafer $W_U$ is lowered while being pressed. At this time, the preset pressing load is applied to the actuator 191 by the air supplied from the electro-pneumatic regulator. The center of the upper wafer $W_U$ and the center of the lower wafer Mare pressed to be in contact with each other by the pressing member 190 (process S14 of FIG. 9). At this time, by stopping the operation of the vacuum pump 177a, the vacuum-exhaust of the upper wafer $W_U$ from the first suction openings 175a in the first suction region 174a is stopped, while carrying on the operation of the second vacuum pump 177b to vacuum-exhaust the second suction region 174b from the second suction openings 175b. When pressing the center of the upper wafer $W_U$ with the pressing member 190, the periphery of the upper wafer $W_U$ can still be held by the upper chuck 140.

Accordingly, the bonding is started between the center of the upper wafer $W_U$ and the center of the lower wafer $W_L$ which are pressed against each other (as indicted by a bold line in FIG. 10). That is, since the front surface $W_{U1}$ of the upper wafer $W_U$ and the front surface $W_{L1}$ of the lower wafer $W_L$ have been modified in the processes S1 and S6, respectively, a Van der Waals force (intermolecular force) is generated between the front surfaces $W_{U1}$ and $W_{L1}$, so that the front surfaces $W_{U1}$ and $W_{L1}$ are bonded. Further, since the front surface $W_{U1}$ of the upper wafer $W_U$ and the front surface $W_{L1}$ of the lower wafer $W_L$ have been hydrophilized in the processes S2 and S7, respectively, hydrophilic groups between the front surfaces $W_{U1}$ and $W_{L1}$ are hydrogen-bonded (intermolecular force), so that the front surfaces $W_{U1}$ and $W_{L1}$ are firmly bonded.

Then, by stopping the operation of the second vacuum pump 177b while still pressing the center of the upper wafer $W_U$ and the center of the lower wafer $W_L$ with the pressing member 190, the vacuum-exhaust of the upper wafer $W_U$ from the second suction openings 175b in the second suction region 174b is stopped. Accordingly, the upper wafer $W_U$ falls down on the lower wafer $W_L$. The upper wafer $W_U$ gradually falls on the lower wafer $W_L$ to be in contact with each other, and the aforementioned bonding between the front surfaces $W_{U1}$ and $W_{L1}$ by the Van der Waals force and the hydrogen-bond is gradually expanded. Accordingly, the entire front surface $W_{U1}$ of the upper wafer $W_U$ and the entire front surface $W_{L1}$ of the lower wafer Mare brought into contact with each other, so that the upper wafer $W_U$ and the lower wafer $W_L$ are bonded (process S15 of FIG. 9).

In this process S15, since the rear surface $W_{U2}$ of the upper wafer $W_U$ is supported by the pins 171, the upper wafer $W_U$ is easily separated from the upper chuck 140 when the vacuum-exhaust of the upper wafer $W_U$ by the upper chuck 140 is released. Thus, the expansion (bonding wave) of the bonding between the upper wafer $W_U$ and the lower wafer $W_L$ takes place in a circular shape, so that the upper wafer $W_U$ and the lower wafer $W_L$ are appropriately bonded.

Thereafter, the actuator 191 of the pressing member 190 is raised up to the upper chuck 140. Further, by stopping the operation of the vacuum pumps 237a and 237b and thus stopping the vacuum-exhaust of the lower wafer $W_L$ in the suction region 234, the attracting and holding of the lower wafer $W_L$ by the lower chuck 141 is stopped. At this time, since the rear surface $W_{L2}$ of the lower wafer $W_L$ is supported by the pins 231, the lower wafer $W_L$ is easily separated from the lower chuck 141 when the vacuum-exhaust of the lower wafer $W_L$ by the lower chuck 141 is released.

Thereafter, the combined wafer $W_T$ obtained by the bonding of the upper wafer $W_U$ and the lower wafer $W_L$ is transferred to the transition device 51 by the wafer transfer device 61, and then is transferred into the cassette $C_T$ of the preset cassette placing table 11 by the wafer transfer device 22 of the carry-in/out station 2. Through these processes, the series of operations of the bonding processing for the wafers $W_U$ and $W_L$ is completed.

According to the exemplary embodiment as described above, in the process S11, the position of the upper chuck 140 with respect to the lower chuck 141 in the rotational direction is adjusted by using the measurement result of the first linear scale 221. At this time, by using the first linear scale 221 which is located at the farthest position from the rotating device 200, the deviation of the upper chuck 140 and the lower chuck 141 in the rotational direction can be investigated more appropriately than in cases of using the other linear scales 222 and 223. Thus, the position of the upper chuck 140 in the rotational direction can be appropriately adjusted.

Further, in the process S12, the horizontal position of the upper chuck 140 with respect to the lower chuck 141 is adjusted by using the measurement results of the three linear scales 221 to 223. Accordingly, even if the horizontal position of the upper chuck 140 is deviated when adjusting the position of the upper chuck 140 in the rotational direction in the process S11, it is possible to correct and adjust the horizontal position of the upper chuck 140 appropriately in the process S12.

Furthermore, in this process S12, in case that the eccentric amount θ of the upper chuck 140 in the rotational direction is not within the preset threshold value, the position of the upper chuck 140 in the rotational direction can be appropriately adjusted.

Since the relative positions between the upper chuck 140 and the lower chuck 141 can be appropriately adjusted in the processes S11 and S12 as stated above, the bonding between the upper wafer $W_U$ held by the upper chuck 140 and the lower wafer $W_L$ held by the lower chuck 141 can be appropriately carried out.

Conventionally, in case of further performing the position adjustment after adjusting the positions of the upper wafer $W_U$ and the lower wafer $W_L$ by using the upper imaging device 151 and the lower imaging device 161 in the process S10, it takes time to accomplish this position adjustment as the upper imaging device 151 and the lower imaging device 161 are used again. According to the present exemplary embodiment, however, since this position adjustment is performed by using the linear scales 221 to 223 in the processes S11 and S12, the position adjustment can be carried out in a short time. Therefore, a throughput of the wafer bonding processing can be bettered.

Moreover, since the bonding system 1 of the present exemplary embodiment is equipped with the surface modifying apparatus 30, the surface hydrophilizing apparatus 40 and the bonding apparatus 41, the bonding of the wafers $W_U$ and $W_L$ can be conducted efficiently within the single system. Therefore, the throughput of the wafer bonding processing can be further improved.

<4. Other Exemplary Embodiments>

Now, other exemplary embodiments of the present disclosure will be explained.

In the bonding apparatus 41 according to the above-described exemplary embodiment, the second linear scale 222 and the third linear scale 223 are disposed at the positions where they form the central angle of 90 degrees with respect to the first linear scale 221, and are disposed to face each other on the central line of the upper chuck stage 180. However, the arrangement of the second linear scale 222 and the third linear scale 223 is not limited thereto. The second linear scale 222 and the third linear scale 223 may be provided at positions where their central angle with respect to the first linear scale 221 forms an angel different from 90 degrees, e.g., 45 degrees, as long as the distance between the first linear scale 221 and the second linear scale 222 and the distance between the first linear scale 221 and the third linear scale 223 are same. If these distances are same even if the central angle is not 90 degrees, the eccentric amount of the upper chuck 140 can be calculated by using the simple equations as the expressions (4) to (6). Thus, the position adjustment of the upper chuck 140 can be carried out through the simple control.

Further, in the bonding apparatus 41 of the above-described exemplary embodiment, the upper chuck 140 is configured to be rotatable. However, the lower chuck 141 may be configured to be rotatable instead. In such a case, the three linear scales 221 to 223 are provided at the lower chuck 141. Further, both the upper chuck 140 and the lower chuck 141 may be configured to be rotatable. In such a case, the three linear scales 221 to 223 may be provided at either the upper chuck 140 or the lower chuck 141.

Moreover, in the bonding apparatus 41 according to the above-described exemplary embodiment, though the lower chuck 141 is configured to be movable in the horizontal direction, the upper chuck 140 may be configured to be movable in the horizontal direction instead, or both the upper chuck 140 and the lower chuck 141 may be configured to be movable in the horizontal direction. Likewise, though the lower chuck 141 is configured to be movable in the vertical direction, the upper chuck 140 may be configured to be vertically movable instead, or both the upper chuck 140 and the lower chuck 141 may be configured to be vertically movable.

In addition, in the bonding system 1 according to the above-stated exemplary embodiment, after the wafers $W_U$ and the $W_L$ are bonded in the bonding apparatus 41, the obtained combined wafer $W_T$ may be heated to a preset temperature (annealing processing). By performing this heating processing on the combined wafer $W_T$, bonding interfaces can be firmly bonded.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept. In the present disclosure, the substrate is not limited to the wafer. The present disclosure is also applicable to various other types of substrates such as a FPD (Flat Panel Display), a mask reticle for photomask, and so forth.

EXPLANATION OF CODES

1: Bonding system
2: Carry-in/out station
3: Processing station
30: Surface modifying apparatus
40: Surface hydrophilizing apparatus
41: Bonding apparatus
61: Wafer transfer device
70: Controller
140: Upper chuck
141: Lower chuck
150: Upper chuck rotator
162: First lower chuck mover
165: Second lower chuck mover
200: Rotating device
221: First linear scale
222: Second linear scale
223: Third linear scale
$W_U$: Upper wafer
$W_L$: Lower wafer
$W_T$: Combined wafer

We claim:

1. A bonding apparatus configured to bond substrates, comprising:
    a first holder configured to vacuum-exhaust a first substrate to attract and hold the first substrate on a bottom surface of the first holder;
    a second holder disposed under the first holder and configured to vacuum-exhaust a second substrate to attract and hold the second substrate on a top surface of the second holder;
    a rotator configured to rotate the first holder and the second holder relatively;
    a moving device configured to move the first holder and the second holder relatively in a horizontal direction;
    three position measurement devices; and
    a controller configured to control the rotator and the moving device based on measurement results of the three position measurement devices,
    wherein the three position measurement devices are all formed along a circumference of the first holder to measure a position of the first holder, or are all formed along a circumference of the second holder to measure a position of the second holder,
    the rotator is provided at a periphery of the first holder or a periphery of the second holder where the three position measurement devices are all formed,
    a first position measurement device is spaced farthest from the rotator among the three position measurement devices, and
    the controller is further configured to control the rotator based on a measurement result of the first position measurement device.

2. The bonding apparatus of claim 1,
    wherein the controller is configured to control the moving device based on the measurement results of the three position measurement devices after controlling the rotator based on the measurement result of the first position measurement device in the three position measurement devices.

3. The bonding apparatus of claim 1,
    wherein the controller is configured to control the rotator and the moving device based on the measurement results of the three position measurement devices after controlling the rotator based on the measurement result of the first position measurement device in the three position measurement devices.

4. The bonding apparatus of claim 2,
    wherein a distance between the first position measurement device and a second position measurement device and a distance between the first position measurement device and a third position measurement device are same.

5. A bonding system equipped with a bonding apparatus configured to bond substrates,
    wherein the bonding apparatus comprises:

a first holder configured to vacuum-exhaust a first substrate to attract and hold the first substrate on a bottom surface of the first holder;

a second holder disposed under the first holder and configured to vacuum-exhaust a second substrate to attract and hold the second substrate on a top surface of the second holder;

a rotator configured to rotate the first holder and the second holder relatively;

a moving device configured to move the first holder and the second holder relatively in a horizontal direction;

three position measurement devices; and a controller configured to control the rotator and the moving device based on measurement results of the three position measurement devices, and wherein the bonding system comprises:

a processing station equipped with the bonding apparatus; and a carry-in/out station configured to place thereon multiple first substrates, multiple second substrates or multiple combined substrates each obtained by bonding the first substrate and the second substrate, and configured to carry the first substrates, the second substrates or the combined substrates into/from the processing station, wherein the processing station comprises:

a surface modifying apparatus configured to modify surfaces of the first substrate or the second substrate to be bonded;

a surface hydrophilizing apparatus configured to hydrophilize the surface of the first substrate or the second substrate modified by the surface modifying apparatus; and a transfer device configured to transfer the first substrates, the second substrates or the combined substrates with respect to the surface modifying apparatus, the surface hydrophilizing apparatus and the bonding apparatus, wherein, in the bonding apparatus, the first substrate and the second substrate having the surfaces hydrophilized by the surface hydrophilizing apparatus are bonded, wherein the three position measurement devices are all formed along a circumference of the first holder to measure a position of the first holder, or are all formed along a circumference of the second holder to measure a position of the second holder, the rotator is provided at a periphery of the first holder or a periphery of the second holder where the three position measurement devices are all formed, a first position measurement device is spaced farthest from the rotator among the three position measurement devices, and the controller is further configured to control the rotator based on a measurement result of the first position measurement device.

6. A bonding method of bonding substrates by using a bonding apparatus, wherein the bonding apparatus comprises:

a first holder configured to vacuum-exhaust a first substrate to attract and hold the first substrate on a bottom surface of the first holder;

a second holder disposed under the first holder and configured to vacuum-exhaust a second substrate to attract and hold the second substrate on a top surface of the second holder;

a rotator configured to rotate the first holder and the second holder relatively;

a moving device configured to move the first holder and the second holder relatively in a horizontal direction; and three position measurement devices, and wherein the bonding method comprises:

measuring the position of the first holder or the second holder by using the three position measurement devices; and adjusting a relative position between the first holder and the second holder by controlling the rotator and the moving device based on measurement results in the measuring of the position, wherein the three position measurement devices are all formed along a circumference of the first holder to measure a position of the first holder, or are all formed along a circumference of the second holder to measure a position of the second holder, the rotator is provided at a periphery of the first holder or a periphery of the second holder where the three position measurement devices are all formed, a first position measurement device is spaced farthest from the rotator among the three position measurement devices, wherein the bonding method further comprises:

measuring the position of the first holder or the second holder by using the first position measurement device; and adjusting the relative position between the first holder and the second holder by controlling the rotator based on a measurement result in the measuring of the position of the first holder or the second holder by using the first position measurement device.

7. The bonding method of claim 6, further comprising:

measuring the position of the first holder or the second holder by using the three position measurement devices; and adjusting the relative position between the first holder and the second holder by controlling the moving device based on the measurement results in the measuring of the position of the first holder or the second holder by using the three position measurement devices.

8. The bonding method of claim 6, further comprising:

measuring the position of the first holder or the second holder by using the three position measurement devices; and adjusting the relative position between the first holder and the second holder by controlling the rotator and the moving device based on the measurement results in the measuring of the position of the first holder or the second holder by using the three position measurement devices.

9. The bonding method of claim 7, wherein a distance between the first position measurement device and a second position measurement device and a distance between the first position measurement device and a third position measurement device are same.

* * * * *

UNITED STATES PATENT AND TRADEMARK OFFICE
CERTIFICATE OF CORRECTION

PATENT NO. : 11,094,667 B2
APPLICATION NO. : 16/347856
DATED : August 17, 2021
INVENTOR(S) : Takashi Nakamitsu et al.

It is certified that error appears in the above-identified patent and that said Letters Patent is hereby corrected as shown below:

In the Specification

Column 17, Line 3, "Mare" should be -- $W_L$ are --.

Column 17, Line 42, "Mare" should be -- $W_L$ are --.

Signed and Sealed this
Seventh Day of June, 2022

Katherine Kelly Vidal
*Director of the United States Patent and Trademark Office*